United States Patent
Oh

(10) Patent No.: US 9,008,134 B2
(45) Date of Patent: Apr. 14, 2015

(54) RESONATOR, VARIABLE WAVELENGTH OPTICAL FILTER, AND VARIABLE WAVELENGTH LASER DIODE

(71) Applicant: Electronics and Telecommunications Research Institute, Daejeon (KR)

(72) Inventor: Kwang Ryong Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/020,928

(22) Filed: Sep. 9, 2013

(65) Prior Publication Data

US 2014/0192827 A1 Jul. 10, 2014

(30) Foreign Application Priority Data

Jan. 8, 2013 (KR) .................. 10-2013-0001994

(51) Int. Cl.
*H01S 3/10* (2006.01)
*G02B 6/10* (2006.01)
*H01S 5/06* (2006.01)

(52) U.S. Cl.
CPC .... *G02B 6/10* (2013.01); *H01S 5/06* (2013.01)

(58) Field of Classification Search
USPC ............................... 372/9, 20, 29.02, 30, 101
See application file for complete search history.

(56) References Cited

U.S. PATENT DOCUMENTS

| 5,217,290 | A | * | 6/1993 | Windross ...................... 362/554 |
| 5,222,794 | A | * | 6/1993 | Windross ...................... 362/554 |
| 5,333,219 | A | | 7/1994 | Kuznetsov |
| 2008/0181262 | A1 | * | 7/2008 | Wakabayashi et al. ........... 372/9 |

OTHER PUBLICATIONS

Mark Kuznetsov et al., "Compact Ultrafast Reflective Fabry-Perot Tunable Lasers for OCT Imaging Applications", Proc. of SPIE, Feb. 22, 2010, pp. 75541F-1~75541F-6, vol. 7554.
Günay Yurtsever et al., "Integrated photonic circuit in silicon on insulator for Fourier domain optical coherence tomography", Proc. of SPIE, Jan. 23, 2010, pp. 75541B-1~75541B-5, vol. 7554.
V. Jayaraman et al., "OCT Imaging up to 760 kHz Axial Scan Rate Using Single-Mode 1310nm MEMS-Tunable VCSELs with >100nm Tuning Range", OSA/CLEO, May 1-6, 2011, pp. 1-2.

* cited by examiner

*Primary Examiner* — Dung Nguyen
(74) *Attorney, Agent, or Firm* — Rabin & Berdo, P.C.

(57) ABSTRACT

A variable wavelength diode according to the inventive concept includes a resonator and a plurality of cylindrical lenses. The resonator includes slab waveguides of which resonance lengths are different from each other. The slab waveguides are disposed on a planar light wave circuit (PLC). Thus, the variable wavelength diode realizes a high variation speed and a continuous variation of a beam at the same time.

7 Claims, 8 Drawing Sheets

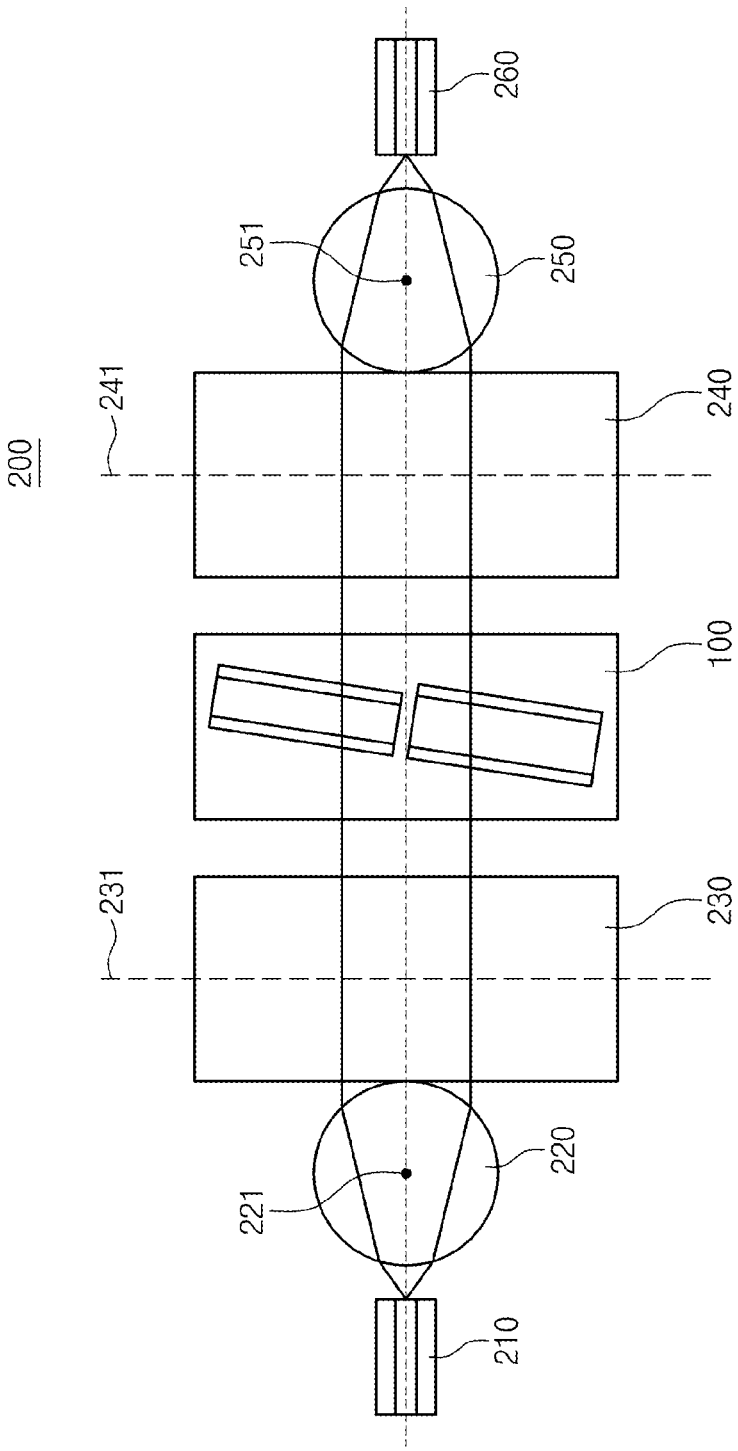

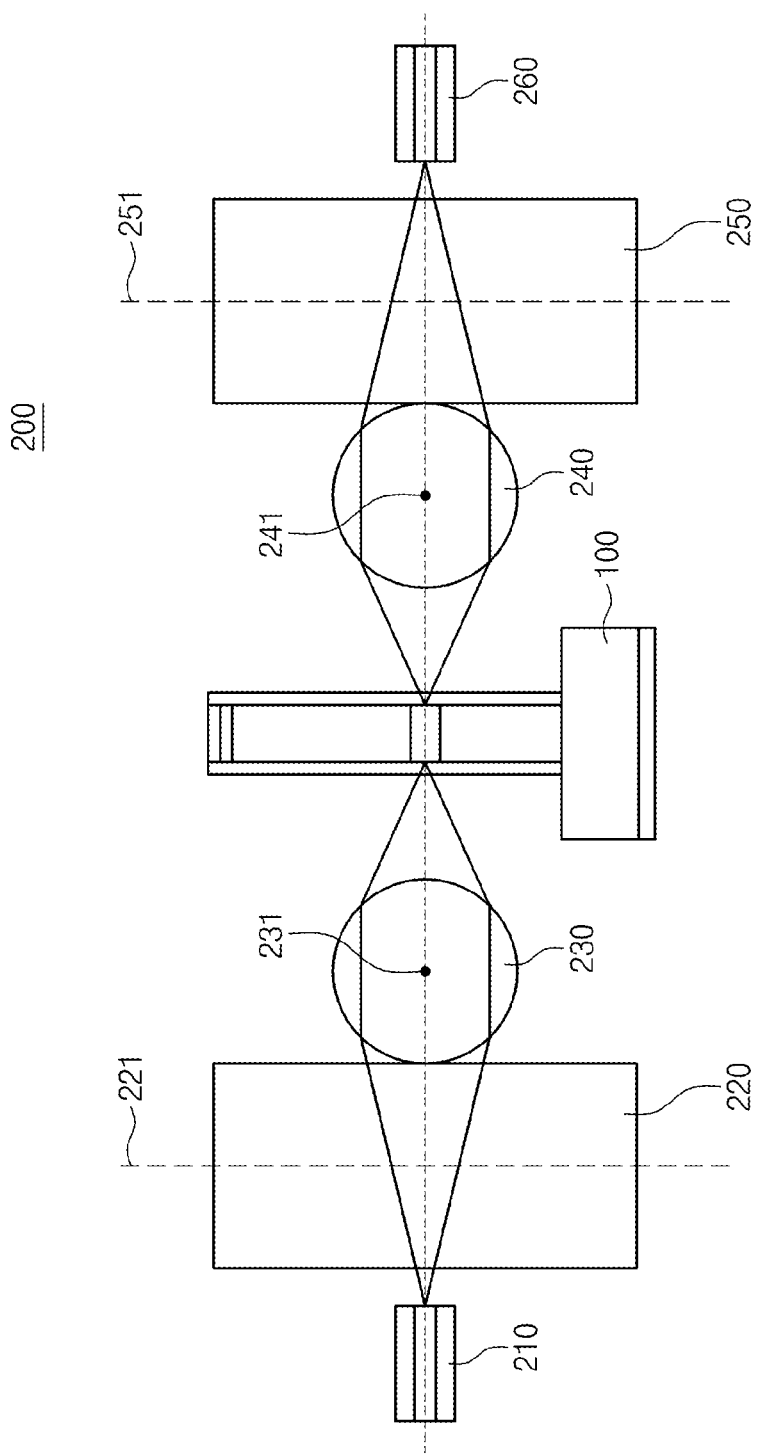

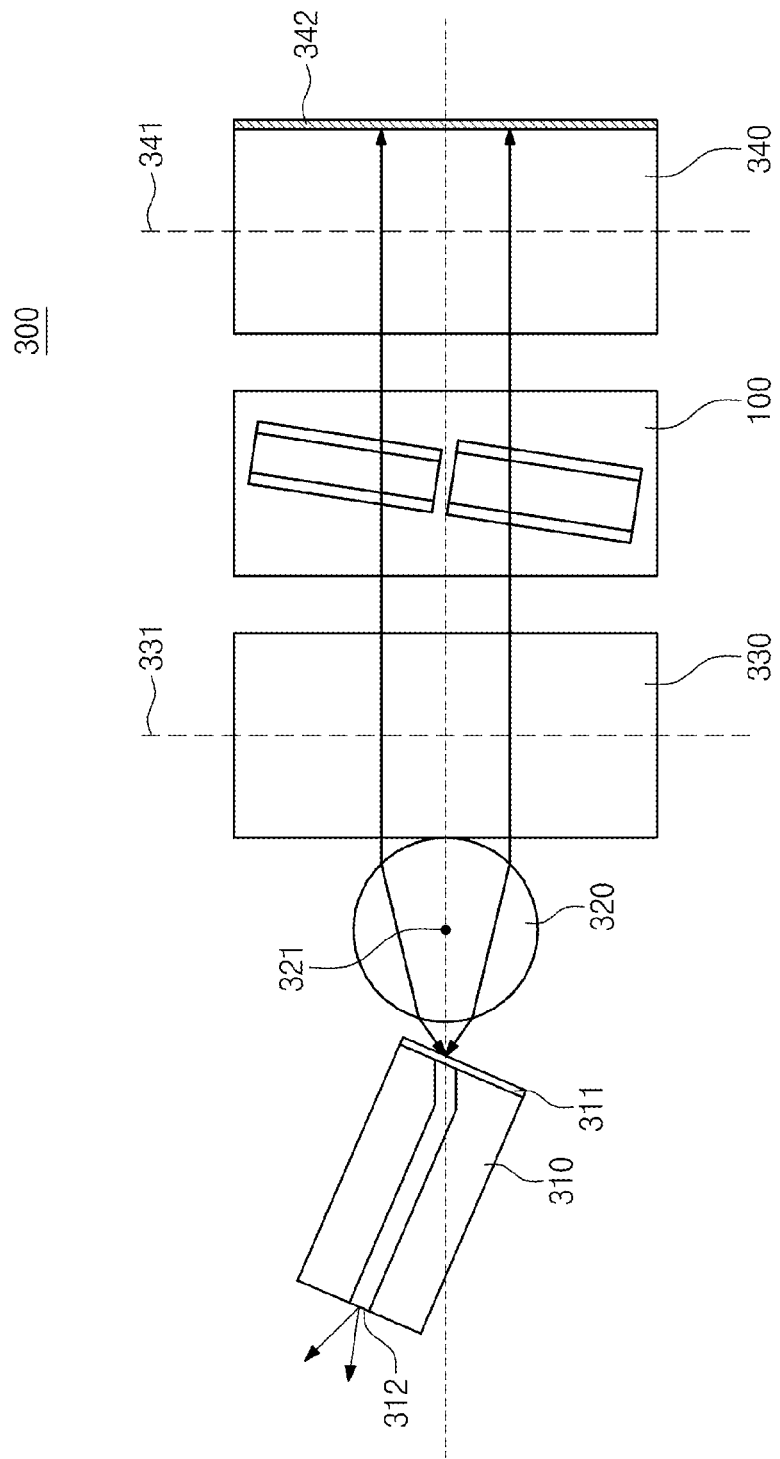

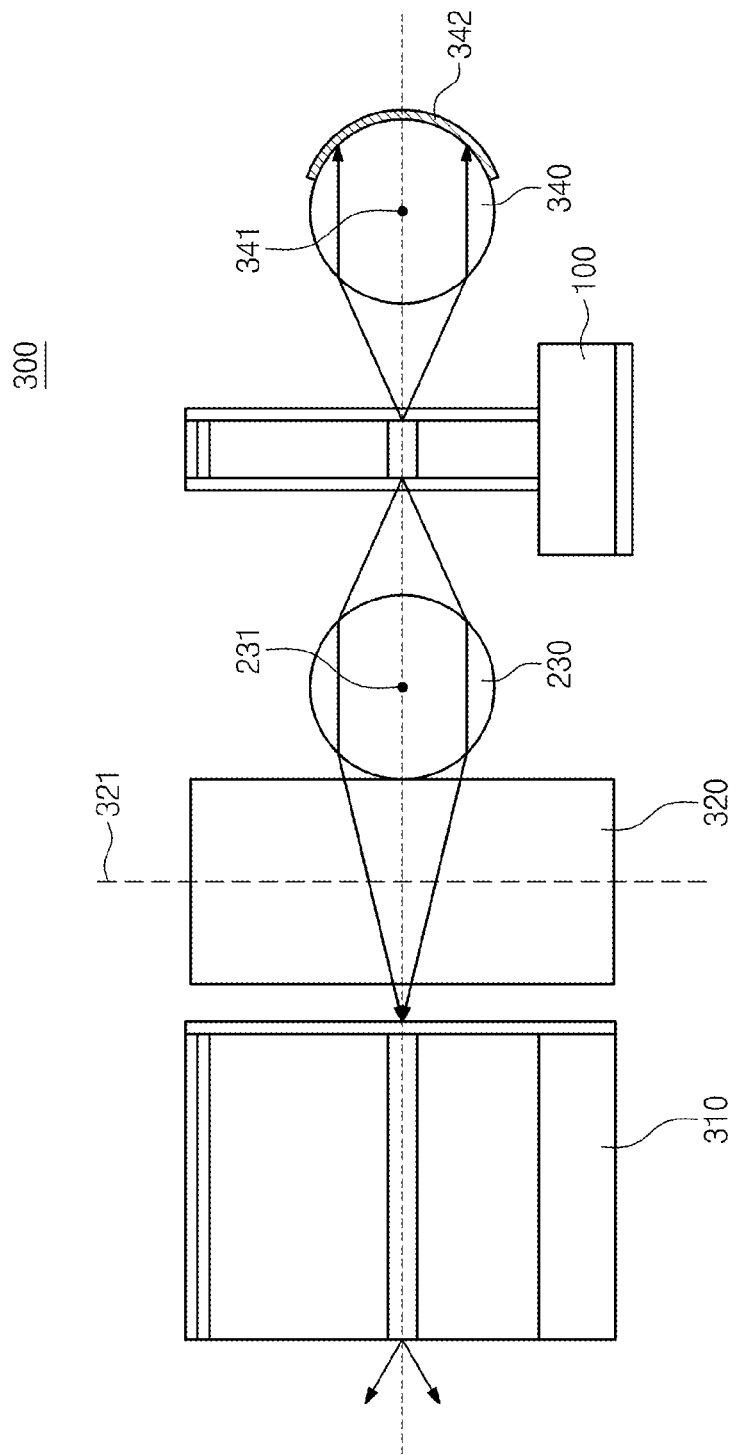

RESONATOR, VARIABLE WAVELENGTH OPTICAL FILTER, AND VARIABLE WAVELENGTH LASER DIODE

CROSS-REFERENCE TO RELATED APPLICATIONS

This U.S. non-provisional patent application claims priority under 35 U.S.C. §119 to Korean Patent Application No. 10-2013-0001994, filed on Jan. 8, 2013, the entirety of which is incorporated by reference herein.

BACKGROUND

The inventive concept relates to an optical communication system and, more particularly, to a resonator including a slab waveguide, a variable wavelength optical filter and a variable wavelength laser diode which have excellent variable wavelength characteristics and support high speed operations.

A variable wavelength optical filter may be realized by various driving methods. A variation speed (or a switching speed) for varying a wavelength and a variable wavelength range are in a trade-off relation in the variable wavelength optical filter. Variable wavelength optical filters in common use have sufficiently wide variable wavelength ranges but provide low switching speeds of, for example, a millisecond level. On the contrary, variable wavelength optical filters having switching speeds of a microsecond level to a nanosecond level have narrow variable wavelength ranges.

A Fabry-Perot (FP) filter corresponding to a typical variable wavelength optical filter has a linear resonator shape including two mirrors. In the FP filter, an incident light may be reflected between the two mirrors or may partially transmit the mirrors, and an interference phenomenon may occur between the reflected and/or transmitted lights. Resonance occurs at regular wavelength intervals by the interference phenomenon, so that the FP filter has a periodic transmission characteristic. For wavelength variation of the FP filter, a distance between the two mirrors may be controlled or refractive indexes of the two mirrors may be controlled.

In the FP filter, the two mirrors may be bonded to a piezoelectric transducer (PZT). A voltage may be applied to the piezoelectric transducer to change the distance between the two mirrors by expansion of the piezoelectric transducer, such that the wavelength variation of the FP filter may be realized. Since the FP filter realizes the wavelength variation by the mechanical change, an operating speed of the FP filter is limited to a millisecond level.

A liquid crystal FP filter may change a refractive index of a liquid crystal disposed within a resonator. The liquid crystal FP shows a Freedericksz transition phenomenon that liquid crystal molecules are rearranged when a predetermined intensity of an electric field is applied to the liquid crystal. Thus, the refractive index of the liquid crystal is changed in the liquid crystal FP filter. The variation speed of the liquid crystal FP filter may be limited by a polarization speed of tens seconds to hundreds seconds.

A micro machined FP filter controls the distance between mirrors by using a semiconductor which is finely modified by electric force or heat. The micro machined FP filter uses a semiconductor device to improve its integration degree and stability. However, the variation speed of the micro machined FP filter may be limited to a speed of tens microseconds to several milliseconds.

A polarization mode conversion filter and a spatial mode conversion filter use mode coupling through energy exchange occurring between modes in an optical waveguide by perturbation. These filter may also have a variation speed of hundreds microseconds or a narrow variable wavelength range.

A filter using a Mach-Zender interferometer has a structure including a phase modulator disposed on an optical waveguide between two couplers. The filter including the Mach-Zender interferometer uses lithium niobate ($LiNbO_3$) as the phase modulator to realize a high speed of several tens nanoseconds. However, the filter using the Mach-Zender interferometer has a complex structure. Thus, it is difficult to fabricate the filter using the Mach-Zender interferometer.

A filter using a diffraction grating changes a period of the grating by lengthening an optical fiber diffraction grating or by applying heat to the grating. However, since the filter of the diffraction grating uses a piezoelectric transducer for a mechanical change of the grating, the filter using the diffraction grating has the variation speed of a millisecond-level.

A distributed feedback (DFB) filter, a distributed Bragg reflector (DBR) filter, and a grating assisted co-directional coupler (GACC) filter having semiconductor waveguide shapes are similar to a semiconductor diode and are controlled by applied currents. The DFB, DBR, and GACC filters realize wavelength variation of several tens nanometers. However, application of the DFB, DBR, and GACC filters may be limited by their narrow variability, discontinuity of variation, and non-stability.

As described above, conventional variable wavelength filters do not satisfy all requirements (i.e., the wide variable wavelength range and the variation speed of a microsecond-level or less).

SUMMARY

Embodiments of the inventive concept may provide a resonator, a variable wavelength optical filter, and a variable wavelength laser diode capable having a wide variable wavelength range and a high variation speed.

In one aspect, a resonator may include: a first slab waveguide; a second slab waveguide spaced apart from the first slab waveguide; and a substrate to which the first and second slab waveguides are connected. A resonance length of the first slab waveguide may be different from a resonance length of the second slab waveguide; and the first slab waveguide may be electrically and optically independent of the second slab waveguide.

In an embodiment, the first slab waveguide and the second slab waveguide may divide an input beam into a first part and a second part, so that the first part and the second part of the input beam may be outputted through the first slab waveguide and the second slab waveguide, respectively.

In an embodiment, each of the first and second slab waveguides may have a PN junction structure for electrical current injection.

In an embodiment, the first and second slab waveguides may be disposed to have a gradient of a predetermined angle from an incidence plane of an input beam in a plan view.

In an embodiment, the first and second slab waveguides may include a 3-5 group compound semiconductor material.

In another aspect, a variable wavelength optical filter may include: a first cylindrical lens receiving a beam, the first cylindrical lens having a central axis perpendicular to an incidence direction of the beam; a second cylindrical lens having a central axis perpendicular to the central axis of the first cylindrical lens, the second cylindrical lens receiving a beam outputted from the first cylindrical lens; a resonator resonating a beam outputted from the second cylindrical lens and outputting the resonated beam; a third cylindrical lens receiving the beam outputted from the resonator, the third cylindrical lens having a central axis parallel to the central axis of the second cylindrical lens; and a fourth cylindrical lens having a central axis perpendicular to the central axis of the third cylindrical lens, the fourth cylindrical lens receiving a beam outputted from the third cylindrical lens.

In an embodiment, the variable wavelength optical filter may further include: an optical fiber input terminal connected to a first optical fiber, the optical fiber input terminal inputting the beam from the first optical fiber into the first cylindrical lens; and an optical fiber output terminal connected to a second optical fiber, the optical fiber output terminal outputting the beam from the fourth cylindrical lens into the second optical fiber.

In an embodiment, the resonator may include: a first slab waveguide; a second slab waveguide spaced apart from the first slab waveguide; and a substrate to which the first and second slab waveguides are connected. A resonance length of the first slab waveguide may be different from a resonance length of the second slab waveguide; and the first slab waveguide may be electrically and optically independent of the second slab waveguide.

In an embodiment, the first slab waveguide and the second slab waveguide may divide an input beam into a first part and a second part, so that the first part and the second part of the input beam may be outputted through the first slab waveguide and the second slab waveguide, respectively.

In an embodiment, each of the first and second slab waveguides may have a PN junction structure for electrical current injection.

In an embodiment, the first and second slab waveguides may be disposed to have a gradient of a predetermined angle from an incidence plane of an input beam in a plan view.

In an embodiment, the first and second slab waveguides may include a 3-5 group compound semiconductor material.

In still another aspect, a variable wavelength laser diode may include: a super-luminescence diode (SLD) receiving and outputting a beam; a first cylindrical lens having a central axis perpendicular to an incidence direction of the beam outputted from the super-luminescence diode, the first cylindrical lens receiving the beam from the super-luminescence diode; a second cylindrical lens having a central axis perpendicular to the central axis of the first cylindrical lens, the second cylindrical lens receiving a beam outputted from the first cylindrical lens; a third cylindrical lens having a central axis parallel to the central axis of the second cylindrical lens, the third cylindrical lens reflecting an input beam by a high-reflective (HR) thin film, and the high-reflective thin film coated on a portion of the third cylindrical lens; and a resonator disposed between the second cylindrical lens and the third cylindrical lens, the resonator outputting a beam from the second cylindrical lens to the third cylindrical lens, and the resonator outputting the beam reflected from the third cylindrical lens into the second cylindrical lens. The first cylindrical lens may output a beam outputted from the second cylindrical lens into the super-luminescence diode.

In an embodiment, a second of the super-luminescence diode, which is adjacent to the first cylindrical lens, may be coated with an anti-reflective thin film for inner resonance; and an input/output section of the super-luminescence diode may be coated with a high-reflective thin film.

In an embodiment, the third cylindrical lens may include a first surface and a second surface opposite to each other; the beam may be inputted to and outputted from the first surface of the third cylindrical lens; and the high-reflective thin film may be disposed on the second surface of the third cylindrical lens.

In an embodiment, the resonator may include: a first slab waveguide; a second slab waveguide spaced apart from the first slab waveguide; and a substrate to which the first and second slab waveguides are connected. A resonance length of the first slab waveguide may be different from a resonance length of the second slab waveguide; and the first slab waveguide may be electrically and optically independent of the second slab waveguide.

In an embodiment, the first slab waveguide and the second slab waveguide may divide an input beam into a first part and a second part, so that the first part and the second part of the input beam may be outputted through the first slab waveguide and the second slab waveguide, respectively.

In an embodiment, each of the first and second slab waveguides may have a PN junction structure for electrical current injection.

In an embodiment, the first and second slab waveguides may be disposed to have a gradient of a predetermined angle from an incidence plane of an input beam in a plan view.

In an embodiment, the first and second slab waveguides may include a 3-5 group compound semiconductor material.

BRIEF DESCRIPTION OF THE DRAWINGS

The inventive concept will become more apparent in view of the attached drawings and accompanying detailed description.

FIG. 5 is a plan view illustrating a variable wavelength optical filter using a resonator according to exemplary embodiments of the inventive concept;

FIG. 6 is a side view of a variable wavelength optical filter of FIG. 5;

FIG. 7 is a plan view illustrating a variable wavelength laser diode using a resonator according to exemplary embodiments of the inventive concept; and FIG. 8 is a side view of a variable wavelength laser diode of FIG. 7.

DETAILED DESCRIPTION OF THE EMBODIMENTS

Figure 1:
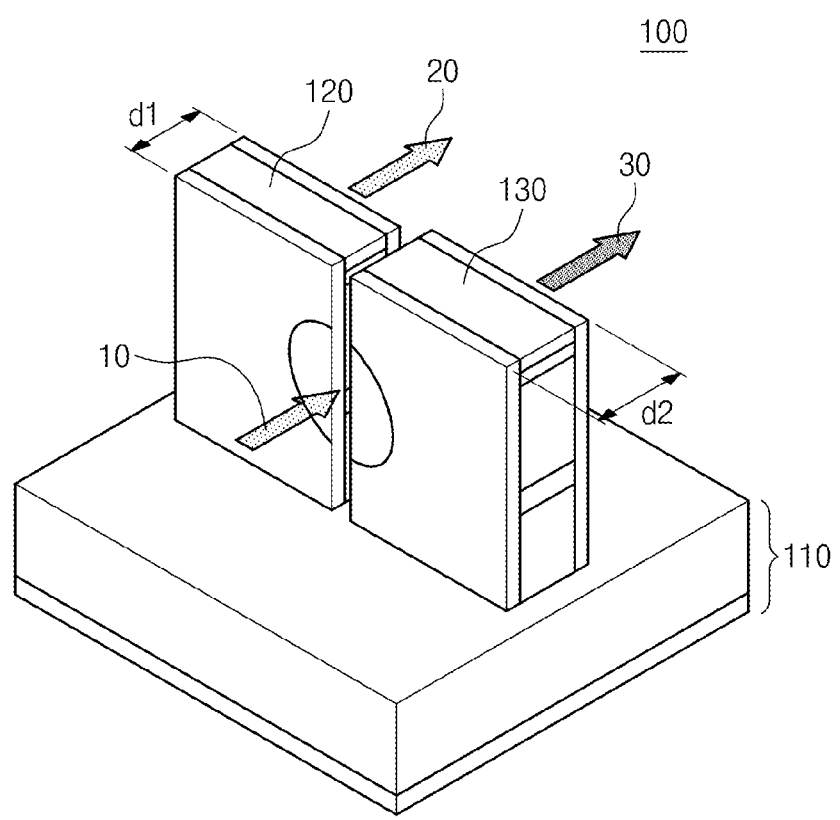
FIG. 1 is a perspective view illustrating a resonator according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Embodiments of the inventive concept provide a variable wavelength optical filter capable of supporting a wide variable wavelength range and a high variation speed simultaneously. Additionally, embodiments of the inventive concept provide a resonator for realizing the variable wavelength optical filter and a variable wavelength laser diode using the resonator.

FIG. 1 is a perspective view illustrating a resonator according to exemplary embodiments of the inventive concept.

Referring to FIG. 1, a resonator 100 includes a substrate 110, a first slab waveguide 120, and a second slab waveguide 130.

The first slab waveguide 120 and the second slab waveguide 130 are disposed on the substrate 110. The first slab waveguide 120 is separated from the second slab waveguide 130 on the substrate 110 in order that the first slab waveguide 120 is electrically and physically independent of the second slab waveguide 130.

The first and second slab waveguides 120 and 130 are spaced apart from each other. The first and second slab waveguides 120 and 130 have predetermined thicknesses from an incidence plane of input beam.

The first slab waveguide 120 may have a first thickness d1, and the second slab waveguide 130 may have a second thickness d2. The first thickness d1 is different from the second thickness d2. For example, the first thickness d1 may be less than the second thickness d2.

The first and second slab waveguides 120 and 130 are optically and electrically independent of each other. To achieve this, the substrate 100 between the first and second slab waveguides 120 and 130 may be etched.

If an electrical current is supplied to each of the first and second slab waveguides 120 and 130, a refractive index of a core layer of each of the first and second slab waveguides 120 and 130 is varied. Thus, a transmission spectrum of each of the first and second slab waveguides 120 and 130 is moved according to the variation of the refractive index.

The input beam 120 is inputted between the first slab waveguide 120 and the second slab waveguide 130 in a horizontal direction. Thus, the input beam 10 is divided into a first part and a second part, so that the first part and the second part are inputted into the first slab waveguide 120 and the second slab waveguide 130, respectively. The first part and the second part of the input beam 10 may correspond to a first half and a second half of the input beam 10, respectively. As a result, two output beams 20 and 30 having free spectral ranges (FSRs) different from each other are outputted. A first output beam 20 is outputted through the first slab waveguide 120, and a second output beam 30 is outputted through the second slab waveguide 130.

Figure 2:
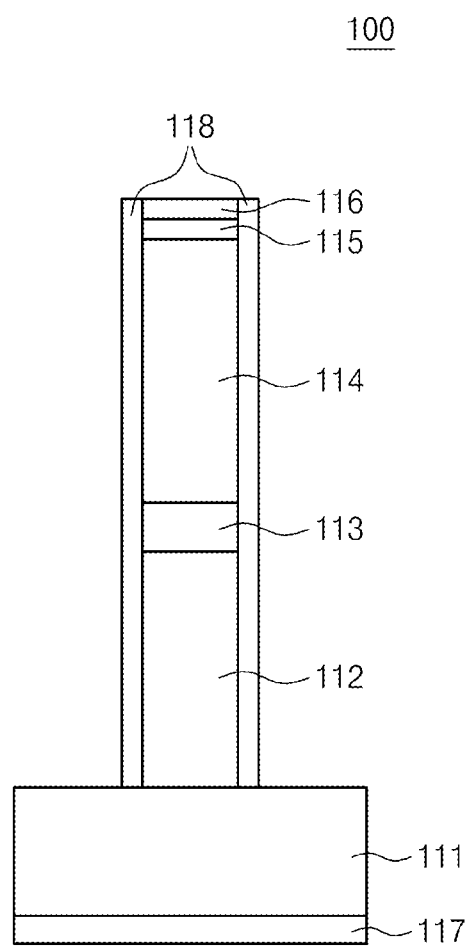
FIG. 2 is a side view of a resonator of FIG. 1.

FIG. 2 is a side view of a resonator of FIG. 1.

Referring to FIG. 2, the resonator 100 includes a n-type indium phosphide (n-InP) substrate layer 111, an n-InP layer 112, an undoped indium-gallium arsenide phosphide (u-InGaAsP) layer 113, a p-type indium phosphide (p-InP) layer 114, a p-type indium-gallium arsenide (p-InGaAs) layer 115, a p-electrode 116, an n-electrode 117, and a high reflective (HR) thin film 118.

The substrate 110 includes the n-InP substrate layer 111 and the n-electrode 117.

Each of the first and second slab waveguides 120 and 130 may consist of the n-InP layer 112, the u-InGaAsP layer 113, the p-InP layer 114, the p-InGaAs layer 115, the p-electrode 116, and the HR thin film 118.

As described above, the resonator 100 is realized as a PN junction double hetero-structure including 3-5 group compound semiconductor materials (e.g., InP, GaAs, gallium antimonide (GaSb)). An electric current can be supplied into the PN junction double hetero-structure.

Figure 3:
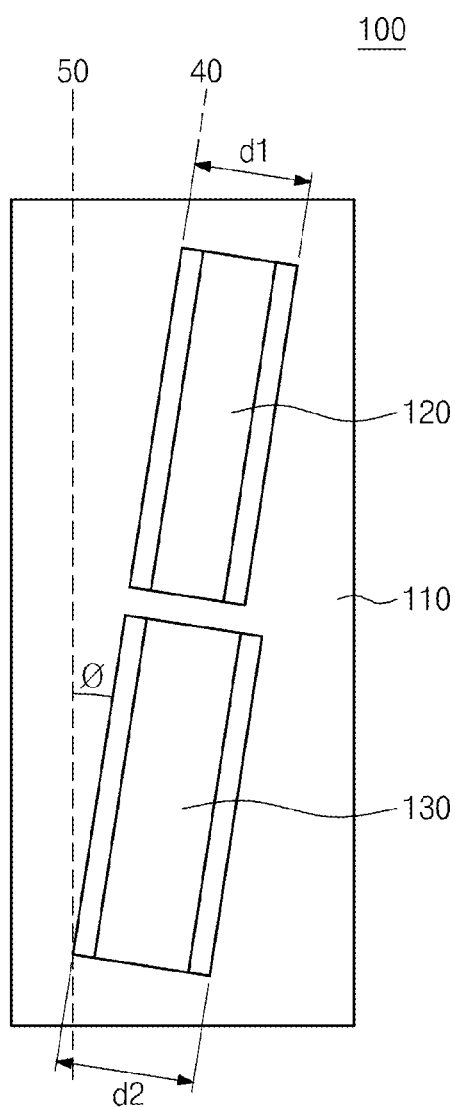
FIG. 3 is a plan view of a resonator of FIG. 1.

FIG. 3 is a plan view of a resonator of FIG. 1.

Referring to FIG. 3, in a plan view, the first and second slab waveguides 120 and 130 are located on an incline plane 40 making a predetermined angle φ with the incidence plane 50 to which light (or a beam) is inputted. For example, the predetermined angle φ may be greater than 0 degree and less than 90 degrees.

As described above, the slab waveguides 120 and 130 are obliquely aligned with respect to the incidence plane 50 of the beam. Thus, a variable wavelength optical filter using the resonator 100 may have a function preventing the beam reflected by a section of the resonator from returning to an input terminal.

Additionally, FIG. 3 illustrates the first thickness d1 of the first slab waveguide 120 which is less than the second thickness d2 of the second slab waveguide 130.

The resonator 100 illustrated in FIGS. 1 to 3 may be defined as a double FSR slab waveguide Fabry-Perot (FP) resonator.

On the other hand, the first and second thicknesses d1 and d2 correspond to resonance lengths of the first and second slab waveguides 120 and 130, respectively. When the variable wavelength optical filter is realized using a Vernier effect with two resonators having the resonance lengths d1 and d2 and the different FSRs from each other, the maximum variable wavelength range is calculated using the following equation 1.

$$2nd1 = m_1 \lambda$$

$$\Delta\lambda_1 = \lambda^2/2nd1$$

$$2nd2 = m_2 \lambda$$

$$\Delta\lambda_2 = \lambda^2/2nd2 \qquad \text{[Equation 1]}$$

In the equation 1, 'n' denotes the effective refractive index of each of the slab waveguides 120 and 130, and 'λ' denotes a center wavelength. Further, 'd1' denotes a first resonance length of the first slab waveguide 120 (i.e., a resonator), and 'd2' denotes a second resonance length of the second slab waveguide 130 (i.e., a resonator). Moreover, '$m_1$' denotes a degree of light in the first slab waveguide 120, and '$m_2$' denotes a degree of light in the second slab waveguide 130. Furthermore, '$\Delta\lambda_1$' denotes a first FSR of the first slab waveguide 120, and '$\Delta\lambda_2$' denotes a second FSR of the second slab waveguide 130. Here, since the FSR should widely expanded for increasing the variable wavelength range, it is necessary to design the resonance length to be short.

For example, if the effective refractive index n, the center wavelength λ, the first FSR $\Delta\lambda_1$, and the second FSR $\Delta\lambda_2$ are 3.342, 1060 nm, 3.9 nm, and 3.77 nm, respectively, the resonance length d1 is 42.29 μm and the second resonance length d2 is 43.75 μm by the equation 1. Thus, the maximum variable wavelength range using the Vernier effect between the two resonators is about 110 nm.

As described above, the selectivity by a wavelength in the resonator 110 may transform the equation 1 into the following equation 2 according to an incidence angle ϕ with respect to a direction perpendicular to the plane of the resonator 100.

$$2nd \cos \phi = m\lambda$$

$$\Delta\lambda = \lambda^2/(2nd \cos \phi + \lambda) \qquad \text{[Equation 2]}$$

In the equation 2, 'n' denotes the effective refractive index of the slab waveguide, and 'λ' denotes a center wavelength. Additionally, 'd' denotes the resonance length of the slab waveguide 120 (i.e., the resonator), 'm' denotes the degree of light in the slab waveguide, and 'Δλ' denotes the FSR of the slab waveguide.

As a result, the two slab waveguides 120 and 130 of the resonator 100 have short resonance lengths and change the FSRs at a high speed of several nanoseconds or less. The two slab waveguides 120 and 130 of the resonator 100 may be realized on a planar light wave circuit (PLC).

The resonator according to the inventive concept uses double slab waveguide having a band gap having a wavelength band shorter than a wavelength band for use. A variable wavelength optical filter or a variable wavelength laser diode using the resonator may provide the wide variable wavelength range and the high variation speed of a microsecond-level or less.

Figure 4:
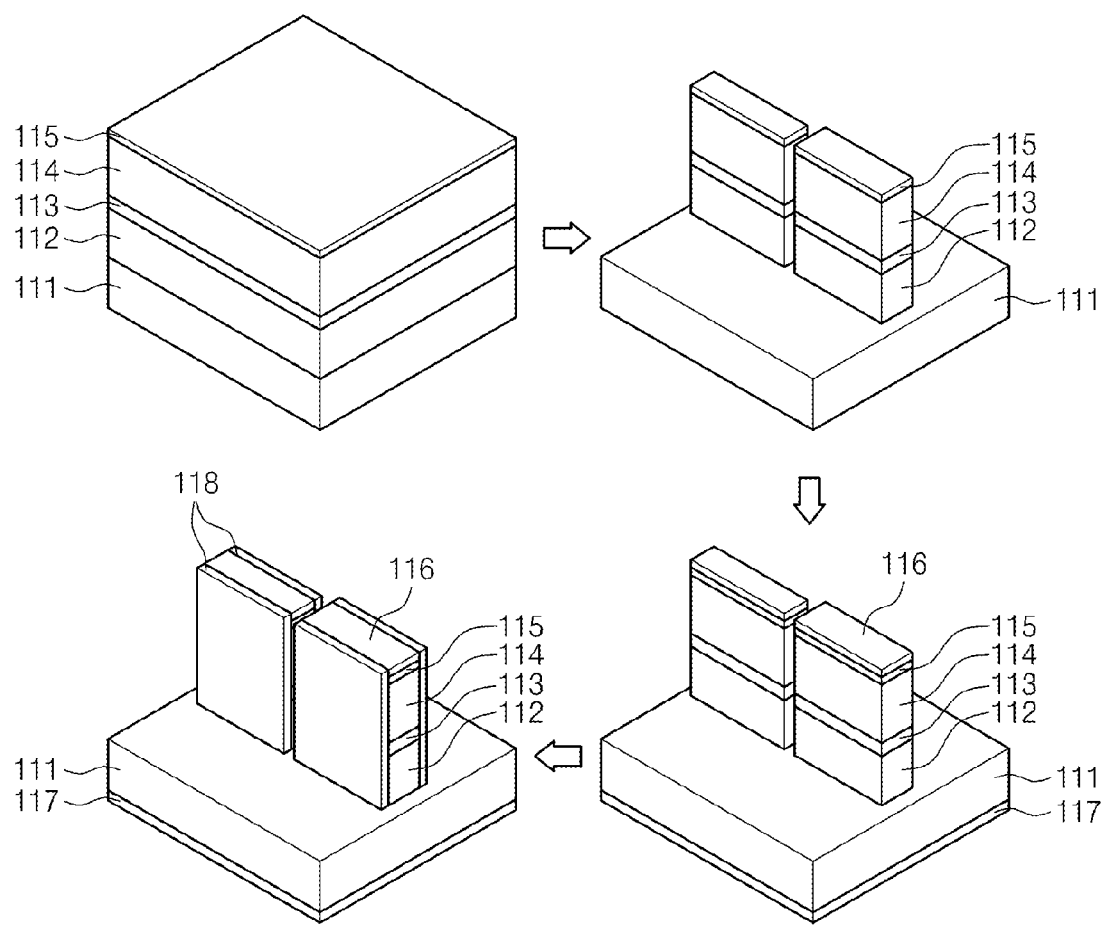
FIG. 4 is a schematic view illustrating a fabricating process of a resonator of FIG. 1.

FIG. 4 is a schematic view illustrating a fabricating process of a resonator of FIG. 1.

Referring to FIG. 4, a fabricating process of the resonator 100 may include four steps.

In a first step, 3-5 group compound semiconductor materials (e.g., InP, GaAs, and GaSb) having band gaps of wavelength bands shorter than a wavelength band for use may be formed by epitaxial growth processes. An n-InP substrate layer 111, an n-InP layer 112, a u-InGaAsP layer 113, a p-InP layer 114, and a p-InGaAs layer 115 are sequentially formed.

In a second step, a Fabry-Perot (FP) patterning process is performed using a lithography process. Thus, two slab waveguides are formed. At this time, an upper portion of a substrate between the two slab waveguides may also be etched.

In a third step, electrodes are formed. A p-type electrode 116 is formed on the p-InGaAs layer of the slab waveguide, and an n-type electrode 117 is formed on a bottom surface of the n-InP substrate layer 111.

In a fourth step, a HR coating process is performed on the slab waveguides. Thus, a HR thin film 118 is formed on the slab waveguides.

As a result, the resonator 100 may be formed using the processes described above.

FIG. 5 is a plan view illustrating a variable wavelength optical filter using a resonator according to exemplary embodiments of the inventive concept.

Referring to FIG. 5, a variable wavelength optical filter 200 may be realized using the resonator 100 described with reference to FIGS. 1 to 3. In other words, the variable wavelength optical filter 200 includes the resonator 100. Additionally, the variable wavelength optical filter 200 may include an optical fiber input terminal 210, cylindrical lenses 220, 230, 240, and 250, and an optical fiber output terminal 260.

The optical fiber input terminal 210 may be connected to a single mode fiber (SMF). The SMF may be inserted into the optical fiber input terminal 210. A beam inputted through the optical fiber input terminal 210 is outputted to a first cylindrical lens 220.

The first cylindrical lens 220 outputs the beam outputted through the optical fiber input terminal 210 to a second cylindrical lens 230. A central axis 221 of the first cylindrical lens 220 is disposed in a direction perpendicular to an incidence direction of the beam.

The second cylindrical lens 230 outputs the beam outputted through the first cylindrical lens 220 to the resonator 100. A central axis 231 is perpendicular to the central axis 221 of the first cylindrical lens 220 and the incidence direction of the beam.

Thus, the first and second cylindrical lenses 220 and 230 make the input beam into a beam parallel with a horizontal direction of the resonator 100 and then condense the parallel beam into the slab waveguides 120 and 130 of the resonator 100.

The resonator 100 resonates the beam inputted from the second cylindrical lens 230 and then outputs the resonated beam to a third cylindrical lens 240. Two output beams are outputted through the first slab waveguide 120 and the second slab waveguide 130. Here, since the slab waveguides 120 and 130 make the predetermined angle with the incidence plane of the beam, a beam reflected by the slab waveguides 120 and 130 does not return to the optical fiber input terminal 210.

The third cylindrical lens 240 outputs the beam outputted through the resonator 100 to a fourth cylindrical lens 250. A central axis 241 of the third cylindrical lens 240 is perpendicular to a traveling direction of the beam outputted through the resonator 100 and a central axis 251 of the fourth cylindrical lens 250. Additionally, the central axis 241 of the third cylindrical lens 240 is parallel to the central axis 231 of the second cylindrical lens 230

The fourth cylindrical lens 250 outputs the beam outputted through the third cylindrical lens 240 to the optical fiber output terminal 260. The central axis 251 of the fourth cylindrical lens 250 is parallel to the central axis 221 of the first cylindrical lens 220.

As a result, the third and fourth cylindrical lenses 240 and 250 make the beam outputted from the resonator 100 into a beam parallel with the horizontal direction of the resonator 100 and then condense the beam into the optical fiber output terminal 260.

For example, the optical fiber output terminal 260 may be connected to a SMF. The SMF of the optical fiber output terminal 260 may be inserted into the optical fiber output terminal 260. The beam condensed into the optical fiber output terminal 210 is outputted through the SMF of the optical fiber output terminal 260.

FIG. 6 is a side view of a variable wavelength optical filter of FIG. 5.

Referring to FIG. 6, the variable wavelength optical filter 200 includes the resonator 100, the optical fiber input terminal 210, the cylindrical lenses 220, 230, 240, and 250, and the optical fiber output terminal 260.

The first and second cylindrical lenses 220 and 230 are disposed between the optical fiber input terminal 210 and the resonator 100. The central axes 221 and 231 of the first and second cylindrical lenses 220 and 230 are perpendicular to each other. The third and fourth cylindrical lenses 240 and 250 are disposed between the resonator 100 and the optical fiber output terminal 260. The central axes 241 and 251 of the third and fourth cylindrical lenses 240 and 250 are perpendicular to each other.

As illustrated in FIG. 6, the central axes 221 and 251 of the first and fourth cylindrical lenses 220 and 250 are parallel to each other, and the central axes 231 and 241 of the second and third cylindrical lenses 230 and 240 are parallel to each other.

FIG. 7 is a plan view illustrating a variable wavelength laser diode using a resonator according to exemplary embodiments of the inventive concept.

Referring to FIG. 7, a variable wavelength laser diode 300 may be realized using the resonator 100 described with reference to FIGS. 1 to 3. Thus, the variable wavelength laser diode 300 includes the resonator 100. Additionally, the variable wavelength laser diode 300 further includes a superluminescence diode (SLD) chip 310 and cylindrical lenses 320, 330, and 340.

The SLD chip 310 may include InP or GaAs. A beam of the SLD chip 310 has an input/output part 312 through which a beam is inputted and outputted. A high reflective (HR) thin film (not shown) may be formed on a section of the input/output part 312 of the SLD chip 310, and an anti-reflective (AR) thin film 311 is formed on an end of the SLD chip 310 which is adjacent to a first cylindrical lens 320. The AR thin film 311 may be formed by an AR coating process.

The first cylindrical lens 320 outputs the beam outputted through the SLD chip 310 to a second cylindrical lens 330. A central axis 321 of the first cylindrical lens 320 is perpendicular to an incidence direction of the beam. Additionally, the first cylindrical lens 320 condenses and outputs a beam outputted from the second cylindrical lens 330 into the SLD chip 310.

The second cylindrical lens 330 outputs the beam outputted through the first cylindrical lens 310 into the resonator 100. A central axis 331 of the second cylindrical lens 330 is perpendicular to the incidence direction of the beam and the central axis 321 of the first cylindrical lens 320. Additionally, the second cylindrical lens 330 outputs a beam outputted from the resonator 100 to the first cylindrical lens 320.

Thus, the first and second cylindrical lenses 320 and 330 make the input beam into a beam parallel with the horizontal direction of the resonator 100 and then condense the parallel beam into the slab waveguides 120 and 130 of the resonator 100.

The resonator 100 resonates the beam inputted from the second cylindrical lens 330 and then outputs the resonated beam to a third cylindrical lens 340. Two output beams are generated through the first slab waveguide 120 and the second slab waveguide 130. Additionally, the resonator 100 outputs a beam reflected from the third cylindrical lens 340 into the second cylindrical lens 330. Here, the resonator 100 does not have a function of a reflection type filter different from the resonator 100 in FIGS. 5 and 6. In other words, the resonator 100 in FIG. 7 has a function of a transmission filter like the resonator 100 of FIGS. 5 and 6. This is because the beam reflected by the HR coated third cylindrical lens 340 returns to an input terminal (i.e., the SLD chip 310).

The third cylindrical lens 340 includes a HR thin film 342 formed by a HR coating process. The HR thin film 342 is formed on a surface of the third cylindrical lens 340 opposite to a surface to which the beam is inputted. The third cylindrical lens 340 reflects the inputted beam toward the SLD chip 310. The third cylindrical lens 340 outputs the reflected beam to the resonator 100. A central axis 341 of the third cylindrical lens 340 is perpendicular to a traveling direction of the beam and is parallel to the central axis 331 of the second cylindrical lens 330. Additionally, the central axis 341 of the third cylindrical lens 340 is perpendicular to the central axis 321 of the first cylindrical lens 320.

FIG. 8 is a side view of a variable wavelength laser diode of FIG. 7.

Referring to FIG. 8, the variable wavelength laser diode 300 includes the resonator 100, the SLD chip 310, and the cylindrical lenses 320, 330, and 340.

The first and second cylindrical lenses 320 and 330 are disposed between the SLD chip 310 and the resonator 100, and the central axes 321 and 331 of the first and second cylindrical lenses 320 and 330 are perpendicular to each other. The third cylindrical lens 340 is disposed at a side of an output terminal of the resonator 100. In other words, the resonator 100 is disposed between the second and third cylindrical lenses 330 and 340. The central axis 321 is parallel to the central axis 331 of the second cylindrical lens 330.

Inner resonance of the variable wavelength laser diode 300 occurs between the AR thin film 311 of the SLD chip 310 and the HR thin film 342 of the third cylindrical lens 340.

The variation speed (e.g., the switching speed for wavelength variation) of the variable wavelength optical filter 200 according to the inventive concept is determined depending on lift times of electrons and holes generated by applying an electrical current to the resonator 100 including the PN junction slab waveguides. Additionally, the variable wavelength range of the variable wavelength optical filter 200 is determined depending on the incidence angle of the input beam, a refractive index of the waveguide, the resonance length of the resonator, and a difference between the resonance lengths of the two slab waveguides. These may be set in due consideration of characteristics of a system.

As described above, the variable wavelength optical filter and/or the variable wavelength laser diode may be realized using the resonator having the two slab waveguides which may be applied with the electrical current. Thus, the variable wavelength optical filter and/or the variable wavelength laser diode may have the wide and stable variable wavelength range, the high variation speed, and a board band. Additionally, the fabricating processes of the variable wavelength optical filer and laser diode may be simplified and their fabricating costs may be reduced.

According to embodiments of the inventive concept, the variable wavelength optical filter includes the resonator and a plurality of the cylindrical lenses. The resonator includes the slab waveguides which have the different resonance lengths from each other and are disposed on the planar light wave circuit (PLC). Thus, the variable wavelength optical filter provides all of the wide variable wavelength range and the high variation speed.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A variable wavelength optical filter comprising:
    a first cylindrical lens receiving a beam, the first cylindrical lens having a central axis perpendicular to an incidence direction of the beam;
    a second cylindrical lens having a central axis perpendicular to the central axis of the first cylindrical lens, the second cylindrical lens receiving a beam outputted from the first cylindrical lens;
    a resonator resonating a beam outputted from the second cylindrical lens and outputting the resonated beam;
    a third cylindrical lens receiving the beam outputted from the resonator, the third cylindrical lens having a central axis parallel to the central axis of the second cylindrical lens; and
    a fourth cylindrical lens having a central axis perpendicular to the central axis of the third cylindrical lens, the fourth cylindrical lens receiving a beam outputted from the third cylindrical lens.

2. The variable wavelength optical filter of claim 1, further comprising:
    an optical fiber input terminal connected to a first optical fiber, the optical fiber input terminal inputting the beam from the first optical fiber into the first cylindrical lens; and
    an optical fiber output terminal connected to a second optical fiber, the optical fiber output terminal outputting the beam from the fourth cylindrical lens into the second optical fiber.

3. The variable wavelength optical filter of claim 1, wherein the resonator comprises:
    a first slab waveguide;
    a second slab waveguide spaced apart from the first slab waveguide; and
    a substrate to which the first and second slab waveguides are connected,
    wherein a resonance length of the first slab waveguide is different from a resonance length of the second slab waveguide; and
    wherein the first slab waveguide is electrically and optically independent of the second slab waveguide.

4. The variable wavelength optical filter of claim 3, wherein the first slab waveguide and the second slab waveguide divide an input beam into a first part and a second part, so that the first part and the second part of the input beam are outputted through the first slab waveguide and the second slab waveguide, respectively.

5. The variable wavelength optical filter of claim 3, wherein each of the first and second slab waveguides has a PN junction structure for electrical current injection.

6. The variable wavelength optical filter of claim 3, wherein the first and second slab waveguides are disposed to have a gradient of a predetermined angle from an incidence plane of an input beam in a plan view.

7. The variable wavelength optical filter of claim 3, wherein the first and second slab waveguides include a 3-5 group compound semiconductor material.

* * * * *